(12) United States Patent
Liang

(10) Patent No.: US 7,278,867 B1
(45) Date of Patent: Oct. 9, 2007

(54) DISPLACEMENT CONTROL DEVICE FOR AN EXTRACTABLE POWER SUPPLY

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/439,168

(22) Filed: May 24, 2006

(51) Int. Cl.
    *H01R 13/62* (2006.01)
(52) U.S. Cl. ...................................... 439/160
(58) Field of Classification Search ............... 439/157, 439/152, 153, 160, 352, 372
    See application file for complete search history.

(56) References Cited

U.S. PATENT DOCUMENTS

| | | | | |
|---|---|---|---|---|
| 3,853,379 A * | 12/1974 | Goodman et al. | ........... | 439/261 |
| 5,344,194 A * | 9/1994 | Hatagishi et al. | ............. | 285/26 |
| 5,797,758 A * | 8/1998 | Tsuchiya et al. | ............ | 439/157 |
| 6,012,933 A * | 1/2000 | Katsuma | ..................... | 439/157 |
| 6,241,540 B1 * | 6/2001 | Tokuwa | ....................... | 439/157 |
| 6,319,050 B1 * | 11/2001 | Miyazaki et al. | ........... | 439/489 |
| 6,517,364 B2 * | 2/2003 | Muramatsu et al. | ........ | 439/157 |
| 6,592,384 B2 * | 7/2003 | Sawayanagi | ................ | 439/157 |
| 6,623,287 B2 * | 9/2003 | Hatagishi et al. | ........... | 439/157 |
| 7,125,272 B1 * | 10/2006 | Liang | ......................... | 439/160 |

* cited by examiner

*Primary Examiner*—Chandrika Prasad
(74) *Attorney, Agent, or Firm*—Troxell Law Office, PLLC

(57) ABSTRACT

A displacement control device for an extractable power supply is composed of a power supply; a handle which is constituted by an upper arm and a lower arm extended transversally and a grip extended vertically, wherein tail ends of the upper and lower arms are formed with about U-shape grooves respectively; and a casing which is provided with at least more than one rectangular slot, with at least one wall of the slot being provided with a pillar which can be located in or outside of the groove according to a displacement of different angle of the handle subjected to a force, enabling the power supply to be emplaced into or out of the casing. The displacement control device is provided with a two-stage exertion of force and a control of displacement direction, so as to improve a safety of operation process and a robustness of positioning the handle at the outer casing.

4 Claims, 5 Drawing Sheets

DISPLACEMENT CONTROL DEVICE FOR AN EXTRACTABLE POWER SUPPLY

BACKGROUND OF THE INVENTION (a) Field of the Invention

The present invention relates to a displacement control device for an extractable power supply, and more particularly to a displacement control device which is provided with a two-stage exertion of force for emplacing a power supply into a casing or extracting it out, so as to improve a safety of operation process.

(b) Description of the Prior Art

It is known that a conventional power supply is not provided with any safety device in a process of being pulled out of or inserted into a casing. In the process of pulling out the power supply, the entire power supply will usually drop on a ground and be damaged from an excessive exertion of force in an initial stage of pulling, due to that it is difficult to control a moment of force. On the other hand, when the power supply is put into the casing, the power supply will not be fixed completely due to an insufficient pressure in a final stage of emplacement, or the power supply will collide with the casing and be damaged due to an excessive exertion of force. Moreover, as a handle is protruded or freely suspended on an exterior of the casing of power supply, the handle will be easily dislocated from collision or being inadequately subjected to a pulling force, thereby enabling the entire power supply to be dislocated.

SUMMARY OF THE INVENTION

The primary object of present invention is to provide a displacement control device for an extractable power supply which is provided with a two-stage exertion of force and a control of displacement direction for emplacing the power supply into a casing or extracting it out, so as to improve a safety of operation process. In addition, a spring of handle can be locked into an outer casing, enabling the handle to be firmly assembled in the outer casing when the handle is not in use, without being dislocated from being inadequately subjected to an external force.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
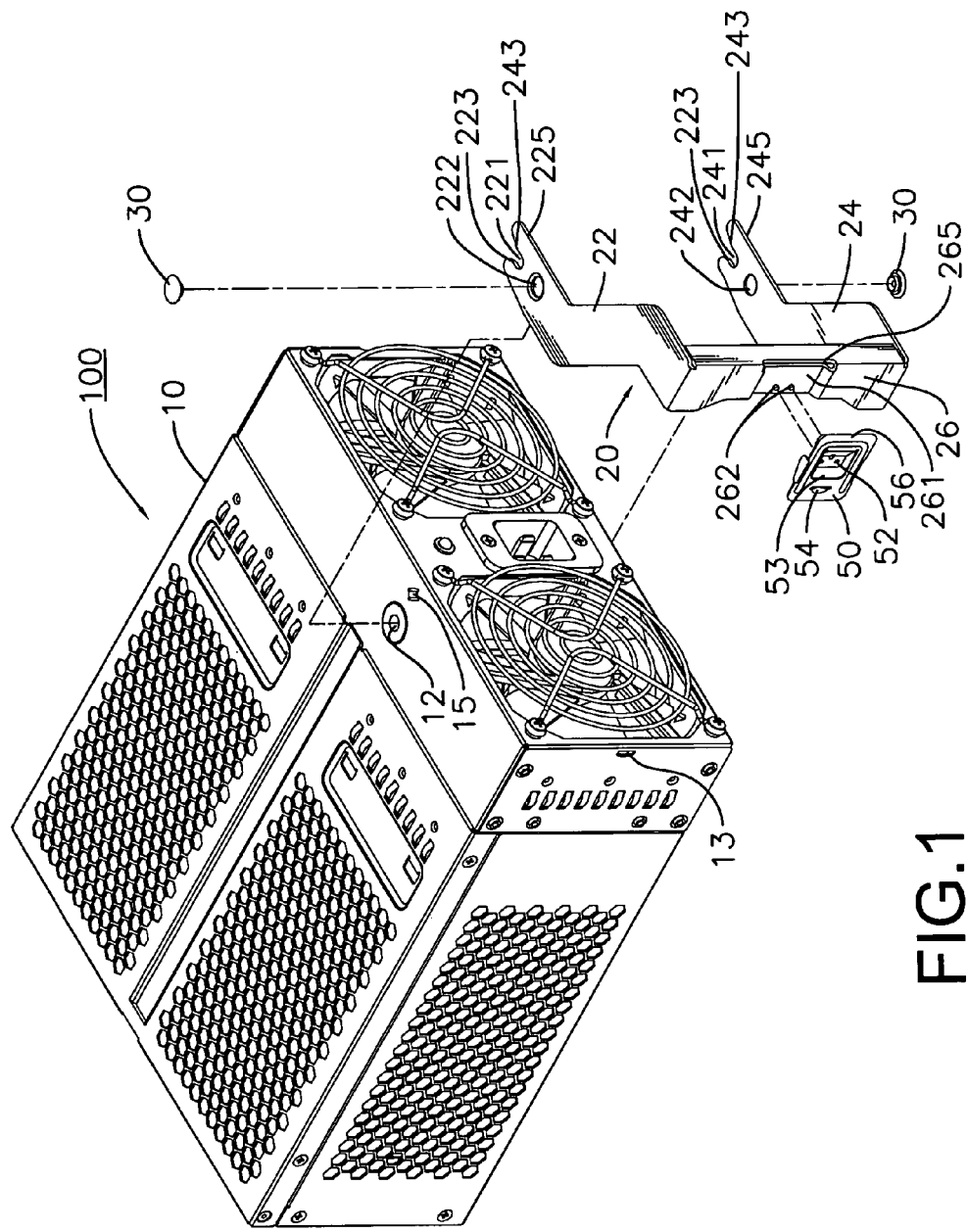
FIG. 1 shows an exploded view of the present invention.
Figure 2:
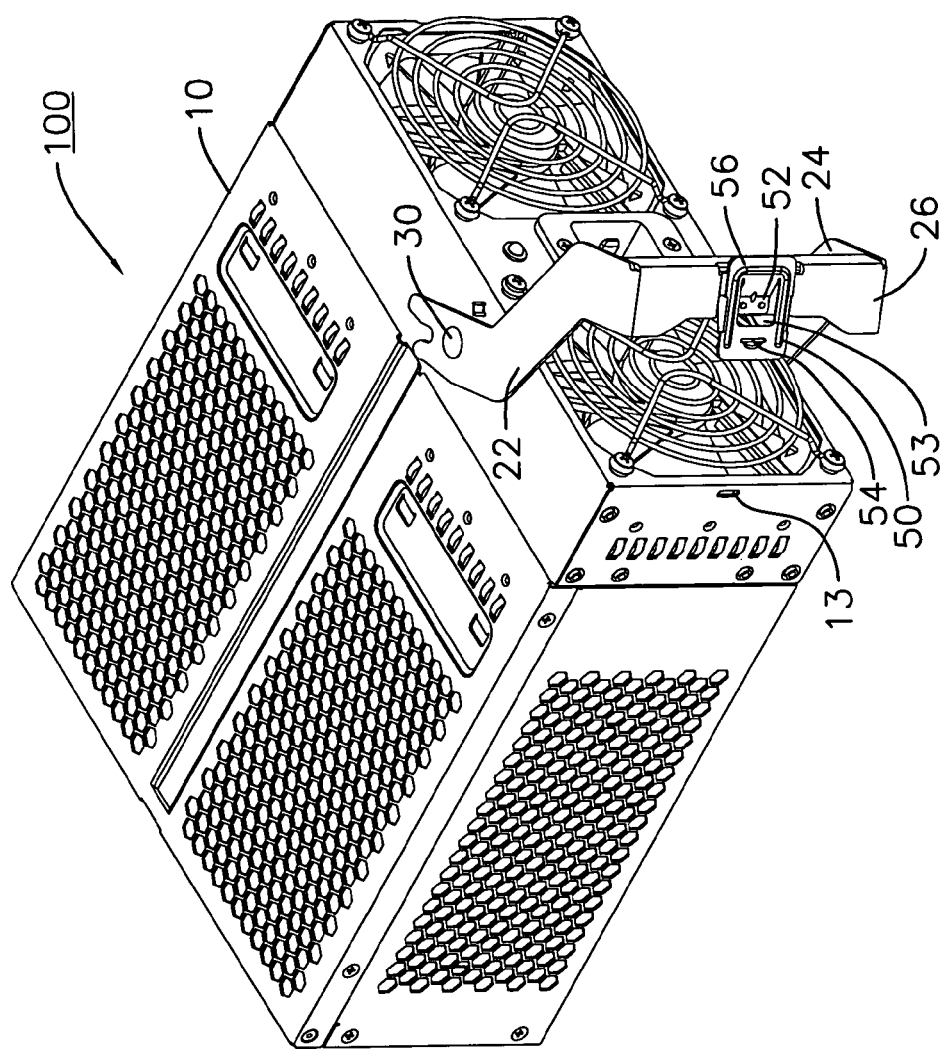
FIG. 2 shows a perspective view of the present invention.
Figure 5:
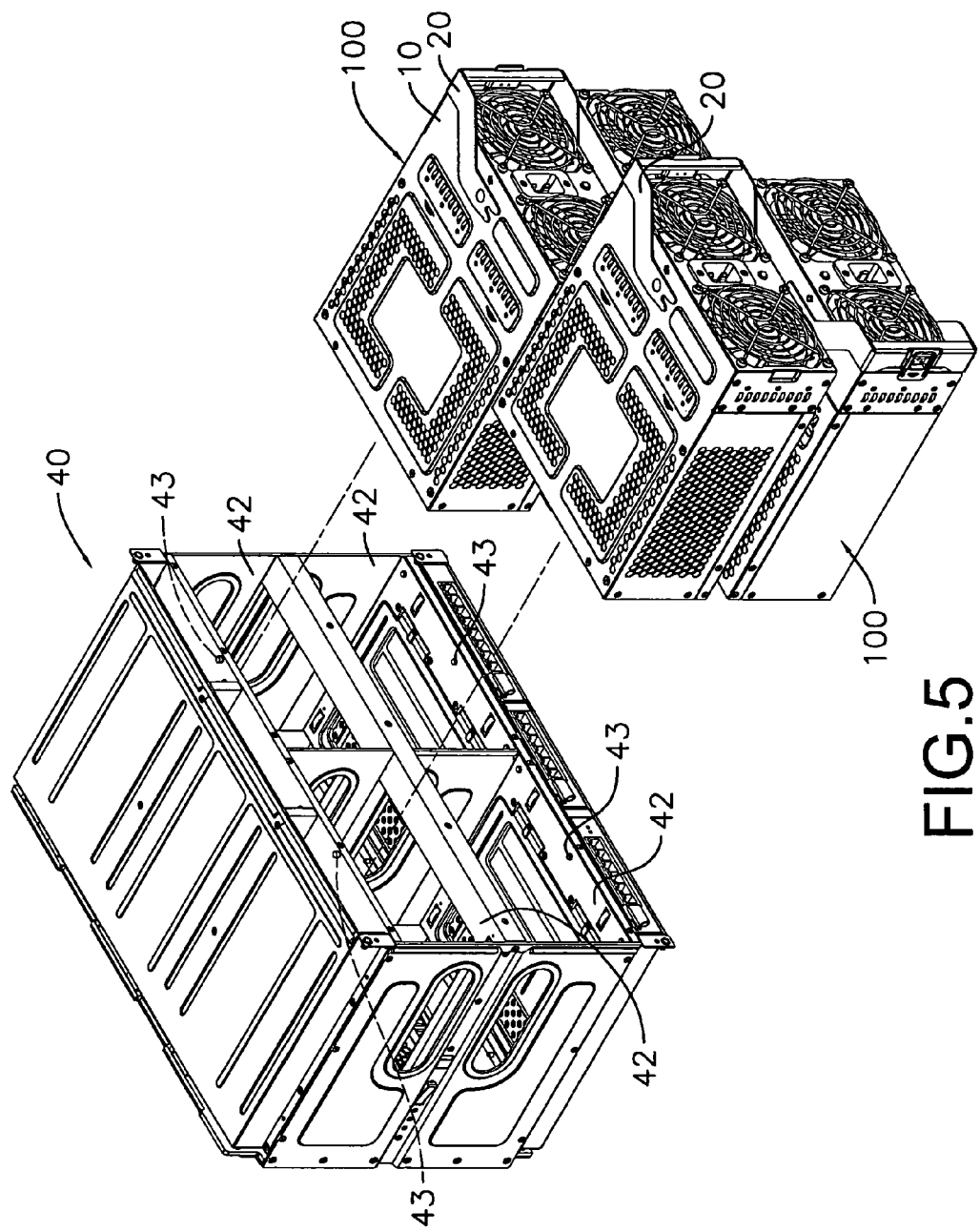
FIG. 5 shows an exploded view of a power supply of the present invention being emplaced into a casing.

Referring to FIG. 1 and FIG. 2, the present invention is to provide a displacement control device for an extractable power supply, which includes a power supply 100 having a rectangular outer casing 10 with an upper and lower surfaces of the outer casing 10 being provided with connection holes 12 respectively; a handle 20 which is composed of an upper arm 22 and a lower arm 24 extended transversally, and a grip 26 extended vertically, wherein tail ends of the upper and lower arms 22, 24 are formed respectively with about U-shape grooves 221, 241, two shaft holes 222, 242 are formed respectively on the upper and lower arms 22, 24, and an external surface of the grip 26 of handle 20 is provided with a concaved part 261; and a spring 50, an interior of which is provided with a fixing piece 52 which is deformed, protruded, tilted inward, fixed on a projected pin 262 of concaved part 261, and is formed with a narrow through-hole 53 at its periphery, a front of which is stamped into a projection part 54 which is protruded from an internal surface of the spring 50, and a material of which is a metallic material which can be deformed elastically. In addition, a side surface of outer casing 10 is provided with a locking slot 13 into which the projection part 54 can be locked. Two shaft pins 30 are transfixed into the two shaft holes 222, 242 and the connection holes 12 located at the upper and lower surfaces of outer casing 10, respectively. A casing 40 is provided with at least more than one rectangular slots 42 (as shown in FIG. 5), and at least one slot wall of which is installed with a pillar 43. According to a displacement of various angle of the handle 20 subjected to a force, front walls 223 and rear walls 243 of the grooves 221, 241 are exerting forces and frictionally sliding on a circumference of the pillar 43.

Figure 3:
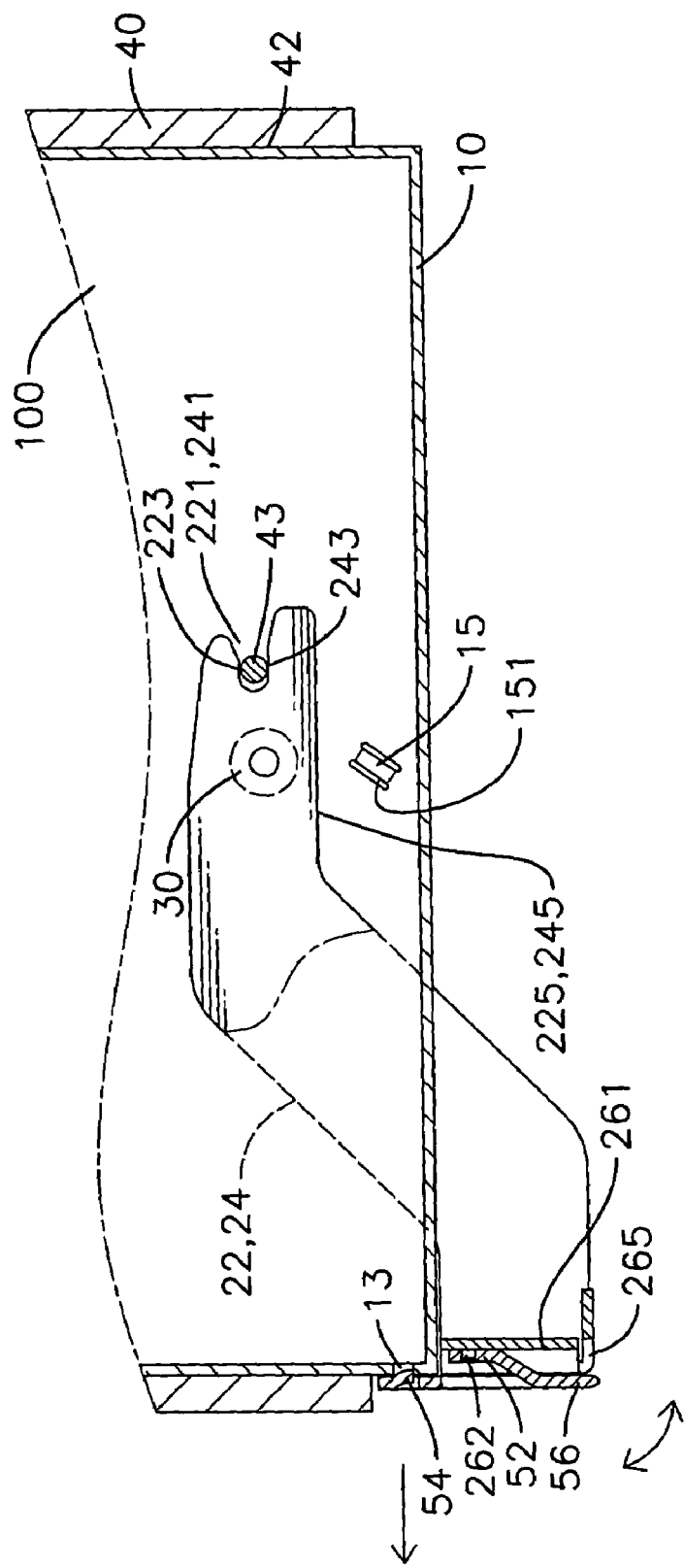
FIG. 3 shows a schematic view of a cross section of operation of the present invention.
Figure 4:
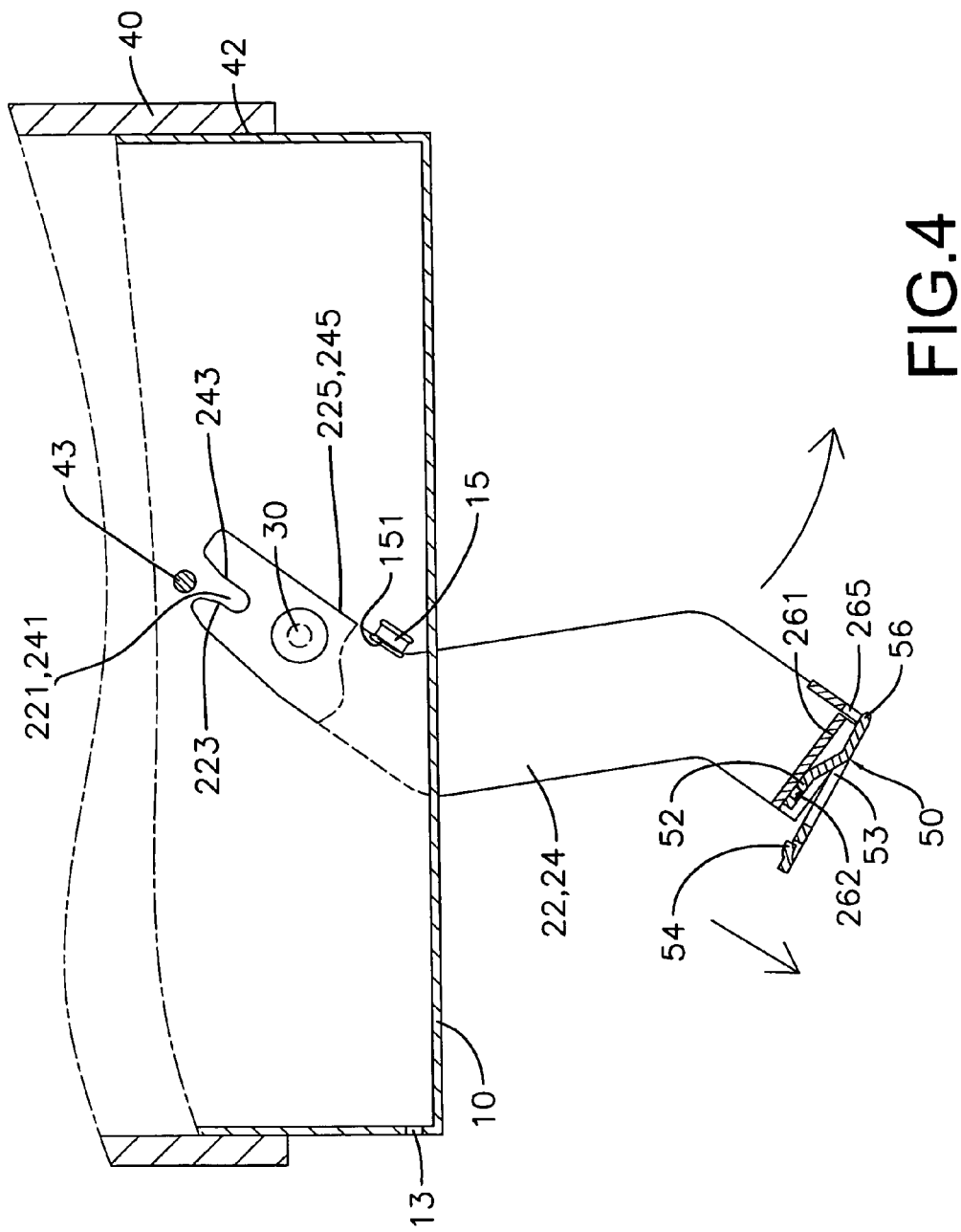
FIG. 4 shows another schematic view of a cross section of operation of the present invention.

Referring to FIG. 1, FIG. 3, and FIG. 4, the grooves 221, 241 are provided with the front walls 223 and the rear walls 243 for providing for exerting the force respectively, and when the front walls 223 are subjected to the force, they can be frictionally sliding along the outer circumference of pillar 43, whereas when the rear walls 243 are subjected to the force, they can be also frictionally sliding along the outer circumference of pillar 43.

Referring to FIG. 1 and FIG. 4, a surface of the outer casing 10 is installed with a positioning projection body 15 which is provided with a side surface 151, and side edges 225, 245 of at least one arm in the upper and lower arms 22, 24 can be abutted on the side surface 151.

Referring to FIG. 1, a side edge of the concaved part 261 of handle 20 is provided with a bevel to form a slant concave surface 265. A surface at rear side of the spring 50 is formed with a press part 56 which can be elastically displaced on the slant concave surface 265, when it is subjected to a force.

Referring to FIG. 1 and FIG. 2, an upper arm 22 and a lower arm 24 have a same and about trapezoidal shape, and a grip 26 of handle 20 is provided for a hand to hold. Whether the handle 20 is pulled out or abutted on an outer casing 10, it is always rotated by a limited angle against shaft pins 30.

Referring to FIG. 3, a power supply 100 is emplaced into a rectangular slot 42 of casing 40, with a projection part 54 being pushed into a locking slot 13, such that the handle 20 can be actually fixed into the outer casing 10. A single pillar 43 can be selectively installed on a lower wall or an upper wall of the slot 42, or the pillars 43 can be both installed on the upper and lower walls; therefore when the handle 20 is in a closed situation, the pillars 43 will be located at inner rims of U-shape grooves 221, 241 (as shown in FIG. 3).

Referring to FIG. 1 and FIG. 4, a human hand is holding the grip 26 with fingers pressing on a press part 56 at a rear end of spring 50. The press part 56 is displaced downward to be close to a slant concave surface 265 and a fixing piece 52 is fixed without moving. Due to a design of narrow through-hole 53, a front end of the spring 50 is easy to be warped outward and deformed, which further enables the projection part 54 to be released from the locking slot 13 (as shown in FIG. 3 and FIG. 4). When a palm is exerting a force outward, the grip 26 will be rotating against the shaft pins 30 to exert a rotational force, as the rear wall 243 is provided with a slope and a length, it will be frictionally sliding along a circumference of the pillar 43, upon being subjected to the force. At this time, the pillar 43 will form a pivot of force, which further enables the outer casing 10 to slide out of the slot 42, until side edges 225, 245 of the upper and lower arms 22, 24 are abutted at a side surface 151 of positioning projection body 15, the grooves 221, 241 are released from the pillars 43, and the pillars 43 are located at exteriors to openings of the grooves 221, 241.

Following that, the palm pulls out the grip 26 vertically, and the entire power supply 100 will be extracted out of the slot 42.

Accordingly, the present invention is provided with a two-stage operation to extract the power supply 100 out of the slot 42. The first stage of extraction (as shown in FIG. 4) is to enable the outer casing 10 to be displaced following a vertical direction due to an action of the rear wall 243 on the pillar 43, without being pulled out abruptly at a first time and dropping on a ground, when the outer casing 10 is being initially pulled out by the hand.

In the second stage of operation for extracting out the power supply 100, an operator should be prepared in advance to use a single hand or both hands to hold a volume of outer casing 10 protruded out of the slot 42, so as to extract the entire power supply 100 out of the slot 42.

Referring to FIG. 3 and FIG. 4, the operator aligns the rectangular outer casing 10 of power supply 100 with an opening of the slot 42, and extends it into a first section of distance, to serve as a first stage of insertion action. By aligning openings of the grooves 221, 241 with the pillars 43, the operator can hold the grip 26 to rotate toward a direction of the slot 42 and to perform an abutting action, to serve as a second stage of insertion action. At this time, the handle 20 will be rotated against the shaft pins 30, the upper and lower arms 22, 24 will form a moment of force, and the front wall 223 will exert the force and be frictionally sliding along a circumference of the pillar 43. In addition, the pillar 43 will form a pivot of force, and the upper and lower arms 22, 24 will form a moment arm for exerting the force, so as to further enable the outer casing 10 to be sliding into the slot 42, until the projection part 54 is locked into the locking slot 13, thereby enabling the handle 20 to be firmly positioned in the outer casing 10, and the pillars 43 being located in interiors of the grooves 221, 241. During a process of acting on the pillars 43 by the front wall 223, the outer casing 10 is linearly displaced in the slot 42, enabling the outer casing 10 to be correctly positioned at a dead point of the slot 42. As the projection part 54 is locked into the locking slot 13, the handle 20 will not be dislocated due to an inadequate action of moment of force (such as a collision); therefore, the handle 20 can be firmly positioned in the outer casing 10.

Referring to FIG. 5, the casing 40 of present invention can be added with a plurality of slots 42 and the power supply 100 can also be plural, which can be emplaced into and extracted out of the slots 42.

Whether the power supply 100 is inserted into the slot 42 or is extracted out of the slot 42, its linear displacement of initial action of inserting into or extracting out of the slot 42 is achieved by relative frictions between the pillars 43 and the front and rear walls 223, 243 of the grooves 221, 241, so as to prevent from a mistake by an abrupt operation of the operator, thereby improving a safety in a process of assembling and disassembling the power supply 100. In addition, when the pillars 43 and the front and rear walls 223, 243 are frictionally sliding with respect to one another, a buffering effect is created to prevent from an abrupt collision in pushing the outer casing 10 into the slot 42.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A displacement control device for an extractable power supply comprising:
   a) a power supply having:
      i) a rectangular outer casing having an upper surface, a lower surface, and a side surface, each of the upper surface and a lower surface having one of two connection holes located therein, the side surface having a locking slot;
      ii) a handle having an upper arm and a lower arm extending transversely, and a grip extended vertically between the upper arm and the lower arm, each of the upper arm and the lower arm have one of two U-shaped grooves located on an end thereof and one of two shaft holes, an exterior surface of the grip of handle has a concaved pin having a projected part;
      iii) a spring having a through-hole located in a center thereof, a fixing piece protruding inwardly from a periphery of the through-hole and extending outwardly from the through-hole, and a projection piece protruding from a first end of the spring, the fixing part is connected to the projected pin of the concaved part, the projection part is selectively inserted into the locking slot located in the side surface of the rectangular outer casing; and
      iv) two shaft pins, each of the two shaft pins being inserted through one of the two shaft holes and a corresponding one of the two connection holes and pivotally connecting the handle to the rectangular outer casing; and
   b) a casing having at least one rectangular slot having two pillars located on opposing surfaces of an interior thereof, the power supply is removably inserted into the at least one rectangular slot,
   wherein a front wall and a rear wall of each of the two U-shaped grooves exerting a force and frictionally sliding on an outer circumference of one of the two pillars, when the handle is pivoted relative to the rectangular outer casing.

2. The displacement control device for an extractable power supply according to claim 1, wherein the front wall of each of the two U-shaped grooves frictionally sliding along the outer circumference of one of the two pillars upon being subjected to a first force, and the rear wall of each of the two U-shaped grooves frictionally sliding along the outer circumference of one of the two pillars upon being subjected to a second force.

3. The displacement control device for an extractable power supply according to claim 1, wherein the rectangular outer casing has a positioning projection body located on an exterior thereof and selectively engaging one of the upper arm and the lower arm and limiting a movement of the handle.

4. The displacement control device for an extractable power supply according to claim 1, wherein the concaved part of handle has a slant concave surface located on a side thereof, the spring has a press part located on second end thereof, the press part being displaced elastically on the slant concave surface when the press part is subjected to a force.

* * * * *